(12) United States Patent
Liu et al.

(10) Patent No.: US 7,199,045 B2
(45) Date of Patent: Apr. 3, 2007

(54) METAL-FILLED OPENINGS FOR SUBMICRON DEVICES AND METHODS OF MANUFACTURE THEREOF

(75) Inventors: Chi Wen Liu, Hsin-Chu (TW); Jung Chih Tsao, Hsin-Chu (TW); Shih Tzung Chang, Hsin-Chu (TW); Ying Lang Wang, Hsin-Chu (TW); Kei Wei Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 141 days.

(21) Appl. No.: 10/854,061

(22) Filed: May 26, 2004

(65) Prior Publication Data

US 2005/0275941 A1    Dec. 15, 2005

(51) Int. Cl.
*H01L 21/4763* (2006.01)

(52) U.S. Cl. .................. 438/629; 438/633; 438/638; 438/692; 257/E21.585

(58) Field of Classification Search .................. None
See application file for complete search history.

(56) References Cited

U.S. PATENT DOCUMENTS

| | | | |
|---|---|---|---|
| 5,731,245 A * | 3/1998 | Joshi et al. ............... | 438/705 |
| 6,010,962 A | 1/2000 | Liu et al. | |
| 6,017,803 A | 1/2000 | Wong | |
| 6,093,656 A | 7/2000 | Lin | |
| 6,110,648 A * | 8/2000 | Jang ........................ | 430/312 |
| 6,117,783 A | 9/2000 | Small et al. | |
| 6,162,728 A | 12/2000 | Tsao et al. | |
| 6,225,223 B1 | 5/2001 | Liu et al. | |
| 6,350,694 B1 | 2/2002 | Chang et al. | |
| 6,372,632 B1 | 4/2002 | Yu et al. | |
| 6,376,376 B1 | 4/2002 | Lim et al. | |
| 6,391,780 B1 | 5/2002 | Shih et al. | |
| 6,444,405 B1 * | 9/2002 | Furukawa et al. .......... | 430/318 |
| 6,461,225 B1 | 10/2002 | Misra et al. | |
| 6,492,273 B1 | 12/2002 | Hofmann et al. | |
| 6,503,827 B1 | 1/2003 | Bombardier et al. | |
| 6,517,668 B2 | 2/2003 | Agarwal | |
| 6,520,840 B1 | 2/2003 | Wang et al. | |
| 6,524,950 B1 | 2/2003 | Lin | |
| 6,530,968 B2 | 3/2003 | Tsuchiya et al. | |
| 6,531,386 B1 | 3/2003 | Lim et al. | |
| 2002/0192941 A1 | 12/2002 | Hsu et al. | |
| 2003/0129828 A1* | 7/2003 | Cohen ...................... | 438/629 |

* cited by examiner

*Primary Examiner*—Walter Lindsay, Jr.
*Assistant Examiner*—Cheung Lee
(74) *Attorney, Agent, or Firm*—Haynes and Boone, LLP

(57) ABSTRACT

A method of forming a metal-filled opening in a semiconductor or other submicron device substrate includes forming a conductive bulk layer over the substrate surface and in the opening, wherein the conductive bulk layer has a first grain size. A conductive cap layer is formed over the conductive bulk layer, the conductive cap layer having a second grain size that is substantially smaller than the first grain size. At least one of the conductive bulk and cap layers are then planarized to form a planar surface that is substantially coincident with the substrate surface.

18 Claims, 3 Drawing Sheets

METAL-FILLED OPENINGS FOR SUBMICRON DEVICES AND METHODS OF MANUFACTURE THEREOF

BACKGROUND

The present disclosure relates generally to the field of integrated circuit fabrication and, more particularly, to fabricating metal-filled openings for submicron integrated circuit technologies.

Semiconductor device geometries continue to dramatically decrease in size, to the extent that existing devices routinely have feature geometries smaller than 90 nm. However, such scaling is accompanied by problems controlling interconnect dishing resulting from planarizing the interconnects after metallization. Those skilled in the art are familiar with the such dishing. The dishing of interconnects and other metal-filled openings is especially prominent when their fabrication employs chemical-mechanical polishing (CMP) to planarize the metal-filled openings.

Another challenge facing the metallization of smaller geometries is providing adequate step coverage and uniformity across the semiconductor substrates. That is, inadequate step coverage or layer uniformity can reduce the quality of the interfaces of inter-metal dielectric (IMD) layers and the metal interconnects, resulting in excessive mechanical and electrical stress between the metal and dielectric layers. Obviously the dishing of interconnects presents an obstacle to obtaining adequate step coverage and layer uniformity. Consequently, interconnect dishing may cause excessive variation in electrical characteristics of the metal interconnects, possibly resulting in IMD failure and, ultimately, device failure.

Metallization employed in the manufacture of integrated circuits for devices with dimensions of 90 nm or less often employs a process generally termed as damascene in which openings such as trenches in an insulative substrate or layer are filled with metal. Copper is frequently employed as the bulk filling interconnect metal. However, copper diffuses easily into many common insulating materials, such as silicon oxide and oxygen containing polymers. Consequently, barrier layers may be incorporated into the damascene process, whereby refractory metals (e.g., TiN, TaN and TiW) are employed as a lining between the copper and the insulative material. However, because existing semiconductor devices may have 30 or more layers of varying composition, the stack of films can suffer internal stress attributable to lattice mismatches where adjacent layers interface. Moreover, such stress may be increased during the manufacturing process, such as from thermal cycling, forces applied during CMP and other manufacturing processes, and the build-up of stress from previously formed layers. As a result, many of the layers may crack or peel, which increases dielectric constants beyond design limits and provides insufficient hardness values, possibly rendering subsequent processing more susceptible to defects. The dishing of any of these layers may contribute to such defects, such that layers formed on interconnect dishing portions may be more susceptible to delamination and stress build-up. Consequently, device yield and performance values may fall below desired levels.

Therefore, a method of forming interconnects and other metal-filled openings is needed to address the problems discussed above.

SUMMARY

The present disclosure relates to a method of forming a metal-filled opening in a semiconductor or other submicron device substrate and a semiconductor device created by the method. In one embodiment, the method comprises forming an opening in a surface of the substrate and forming a conductive bulk layer over the substrate surface and in the opening, wherein the conductive bulk layer has a first grain size. A conductive cap layer is formed over the conductive bulk layer, the conductive cap layer having a second grain size that is substantially smaller than the first grain size. At least one of the conductive bulk and cap layers are then planarized to form a planar surface that may be substantially coincident with the substrate surface.

In another embodiment, the method includes forming a plurality of active devices in a substrate, forming a dielectric layer over the active devices, and forming a metal-filled opening interconnecting the active devices. The step of forming the metal-filled openings includes forming a recess in a surface of the dielectric layer and extending to at least one of the active devices, forming a conductive bulk layer over the dielectric layer surface and contacting the at least one active device in the recess, the conductive bulk layer having a first grain size, forming a conductive cap layer over the conductive bulk layer, the conductive cap layer having a second grain size that is substantially smaller than the first grain size, and planarizing at least one of the conductive bulk and cap layers to form a planar surface that is substantially coincident with the dielectric layer surface.

In another embodiment, a semiconductor device is provided. The semiconductor device includes an opening formed in a surface of a substrate and a conductive bulk layer formed in the opening. The conductive bulk layer has a planar surface portion and a non-planar surface portion at least partially within the opening. The semiconductor device also includes a conductive cap layer formed over the non-planar surface portion of the conductive bulk layer. The conductive cap layer has a second grain size that is substantially smaller than a first grain size of the conductive bulk layer, and has a planar surface that is substantially coincident with the substrate surface.

DETAILED DESCRIPTION

Figure 1:
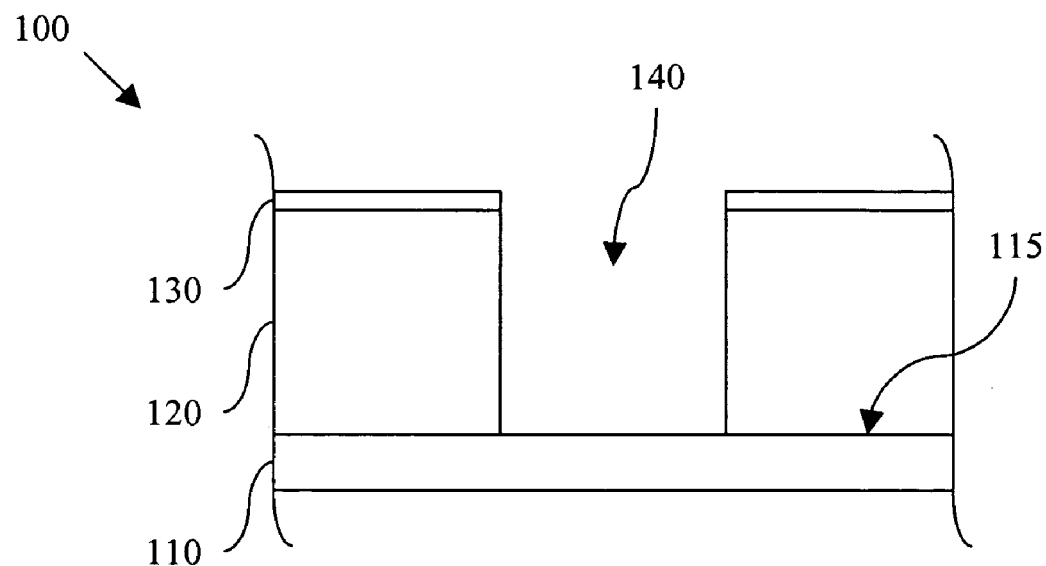
FIGS. 1 and 2 illustrate sectional views of one embodiment of a metal-filled opening during intermediate stages of manufacture according to aspects of the present disclosure.

The present disclosure relates generally to the field of integrated circuit fabrication and, more particularly, to fabricating a metal-filled opening in a semiconductor or other substrate for submicron integrated circuit technologies. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring initially to FIG. 1, illustrated is a sectional view of one example of a device 100 in a preliminary stage of manufacture according to aspects of the present disclosure. Only a portion of the device 100 is illustrated in FIG. 1 so that one example of a metal filled-opening constructed according to aspects of the present disclosure may be more clearly described.

The device 100 includes a substrate 110 having a dielectric layer 120 formed on a surface 115 of the substrate 110. The substrate 110 may be or include a contact to a semiconductor device or metal interconnect (not shown), and may be conventional in composition and manufacture. For example, the substrate 110 may be or include a semiconductor wafer or other layers formed on a semiconductor substrate.

The dielectric layer 120 may be a low-k or extremely low-k (ELK) dielectric, such as MesoELK™, a product of the Schumacher company of Carlsbad, Calif. In one embodiment, the dielectric layer 120 may be a porous $SiO_2$ film in which the pores may be filled with an inert gas or air to provide low-k dielectric properties. The dielectric layer 120 may be formed by atomic layer deposition (ALD), chemical vapor deposition (CVD), plasma enhanced CVD (PECVD), spin-on coating or other conventional or future-developed deposition processes. In one embodiment, the substrate 110 may be at least partially insulative, such that the dielectric layer 120 may be an integral region of the substrate 110 rather than a discrete layer formed on the substrate 110. However, for the purpose of clarity and brevity, the following discussion will assume that the dielectric layer 120 is a discrete layer formed on the substrate 110, although such treatment does not limit the scope of the present disclosure.

As shown in FIG. 1, an etch stop layer 130 may also be formed on the dielectric layer 120, although the etch stop layer 130 may not be employed in all applications. Generally, the etch stop layer 130 may aid in the end-point determination of a CMP or other planarization process. The etch stop layer 130 may comprise silicon nitride or silicon oxide, and may be deposited on the dielectric layer 120 by CVD, PECVD, ALD or other conventional or future-developed deposition processes.

FIG. 1 also depicts the formation of a recess or opening 140 in the dielectric layer 120 and etch stop layer 130. The opening 140 may also extend past the dielectric layer 120 into and possibly beyond the substrate 110, such as in those embodiments in which the substrate 110 is employed as a contact to a semiconductor device or metal interconnect (not shown), as discussed above. There are myriad processes by which the opening 140 may be formed, such as dry and plasma etching processes, possibly in conjunction with a mask (not shown). Moreover, the opening 140 may be formed in-situ with the processes employed to form the dielectric layer 120 and/or etch stop layer 130. The dimensions of the opening 140 are not limited by the present disclosure, and may be tailored to application-specific requirements. In general and without limiting the scope of the present disclosure, the aspect ratio of the opening 140 may be as high as about 30:1.

Figure 2:
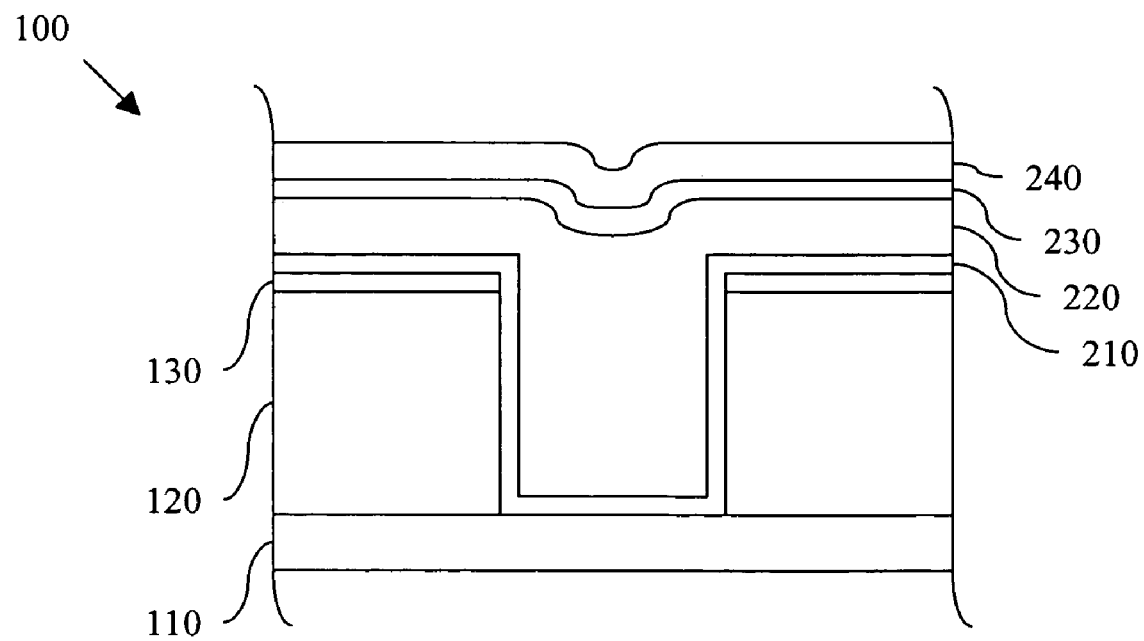

Referring to FIG. 2, illustrated is a sectional view of the device 100 shown in FIG. 1 in a subsequent stage of manufacture according to aspects of the present disclosure. After the opening 140 is formed in the dielectric layer 120 and the etch stop layer 130, the opening 140 may be lined with a barrier layer 210. As shown in FIG. 2, the barrier layer 210 may also be formed on the etch stop layer 130. The barrier layer 210 may include Ti, TiN, Ta, TaN, TiW or other appropriate barrier materials. The barrier layer 210 may not be required in all applications, but may generally prevent diffusion of a subsequently formed conductive bulk layer 220 into the dielectric layer 120 and substrate 110. The barrier layer 210 may also improve the adhesion of the conductive bulk layer 220 in the opening 140, and may enhance the electrical characteristics of the conductive bulk layer 220, such as by reducing resistance. The barrier layer 210 has a thickness ranging between about 5 and about 50 nm.

In one embodiment, the barrier layer 210 may be formed by PVD, which may provide desired levels of purity and metal precursor penetration. However, the barrier layer 210 may exhibit improved step coverage and void prevention when formed by CVD or ALD, particularly when the thickness is less than about 10 nm. Those skilled in the art are familiar with barrier layers employed as dielectric linings, and will recognize that myriad processes exist for forming the barrier layer 210.

After the barrier layer 210 has been formed, if at all, the conductive bulk layer 220 may be formed in the opening 140. As shown in FIG. 2, the conductive bulk layer 220 may also be formed on the dielectric layer 120 opposing the etch stop layer 130 and the barrier layer 210, if they have been formed. The conductive bulk layer 220 may comprise copper or an alloy thereof, although other materials may be used, such as gold, tungsten and other conductive materials. The thickness of the conductive bulk layer 220 may vary, and may possibly depend on the deposition process employed or other fabrication parameters. However, the present disclosure does not limit the conductive bulk layer to any specific thickness.

The conductive bulk layer 220 may be formed as part of a damascene process. Moreover, although the conductive bulk layer 220 shown in FIG. 2 may resemble a single damascene structure, the conductive bulk layer 220 may also form a dual-damascene structure, as known to those skilled in the art. In general, as with the other layers described above, there are many processes by which the conductive bulk layer 220 may be formed, whether as a damascene or other structure. For example, the conductive bulk layer 220 may be formed by an electroplating process such as ECP, which electroplates copper into the opening 140. As a further example, the conductive bulk layer 220 may also be formed by depositing a copper CVD or PVD seed layer that is subsequently plated, or by depositing the conductive bulk layer 220 in the opening 140 by PVD or CVD with or without a seed layer. Exemplary PVD processes which may be employed to deposit the conductive bulk layer 220 may also include those that utilize ionized metal plasma (IMP), collimated PVD processes, long-throw PVD processes or magnetron PVD processes. The formation of the conductive bulk layer 220 may also include the use of an organometallic precursor, such as Cu(I) hexafluoroacetonate (Hfac). One such precursor is CupraSelect™, provided by the Schumacher company of Carlsbad, Calif. Of course, those skilled in the art will recognize that the present disclosure does not limit the formation of the conductive bulk layer 220 to any particular process.

A conductive cap layer 230 may then be formed on the conductive bulk layer 220, as shown in FIG. 2. Although the conductive cap layer 230 is depicted as a single layer, the conductive cap layer 230 may also include multiple layers. Moreover, rather than a discrete layer as depicted in FIG. 2, it is intended that the conductive cap layer 230 may also be a region of the conductive bulk layer 220 formed by altering the process parameters employed to form the conductive bulk layer 220. Generally, although the conductive cap layer 230 is shown in FIG. 2 as substantially covering the conductive bulk layer 220, the advantages described in the present disclosure may be obtained if the conductive cap layer 230 substantially spans the portion of the conductive bulk layer 220 in the opening 140, such as in embodiments in which the conductive cap layer 230 is selectively deposited (in contrast to blanket deposition).

The conductive cap layer 230 generally comprises harder material than the conductive bulk layer 220. In one embodiment, this may be achieved by providing a conductive cap layer 230 having a grain size that is smaller than the grain size of the conductive bulk layer 220. For example, as discussed above, the conductive cap layer 230 may be formed in-situ to the process employed to form the conductive bulk layer 220, such as an ECP process, wherein process parameters may be modified after the conductive bulk layer 220 has been formed to promote smaller grain growth relative to the conductive bulk layer 230. The conductive cap layer 230 may also be formed ex-situ to the process(es) employed in the formation of the conductive bulk layer 220, whether or not the formation of the conductive cap layer 230 is similar to the formation of the conductive bulk layer 220.

As with the conductive bulk layer 220, there are many processes by which the conductive cap layer 230 may be formed. For example, the conductive cap layer 230 may be formed by CVD, MOCVD, PECVD, ALD, PVD, IMP PVD, electroless plating or other conventional or future-developed processes. The conductive cap layer 230 may comprise copper or other materials which may be formed having a grain size substantially smaller than the grain size of the conductive bulk layer 220. In one embodiment, the grain size of the conductive cap layer 230 may be less than about 0.1 micron in diameter.

As with the conductive bulk layer 220, the conductive cap layer 230 may vary in thickness according to application-specific requirements. The conductive cap layer 230 may have a thickness ranging between about 1000 Angstroms and about 2000 Angstroms, although the present disclosure does not limit the conductive cap layer 230 to any particular thickness. Generally, the conductive cap layer 230 may have a thickness that most appropriately corresponds to the process conditions that may provide a significant reduction or elimination of dishing resulting from subsequent planarization.

As shown in FIG. 2, a second conductive bulk layer 240 may be formed on the conductive cap layer 230. The second conductive bulk layer 240 may have a grain size that is substantially larger than the grain size of the conductive cap layer 230. For example, the grain size of the second conductive bulk layer 240 may be substantially similar to the grain size of the first conductive bulk layer 220. In one embodiment, the second conductive bulk layer 230 may be formed by process parameters that are substantially similar to those employed to form the first conductive bulk layer 220. Moreover, the conductive bulk layers 220, 240 and conductive cap layer 230 may be formed in-situ. While the second conductive bulk layer 240 may be advantageous in some applications, such as when the aspect ratio of the opening 140 illustrated in FIG. 1 is relatively small, the second conductive bulk layer 240 may not be required in all applications.

Figure 3:
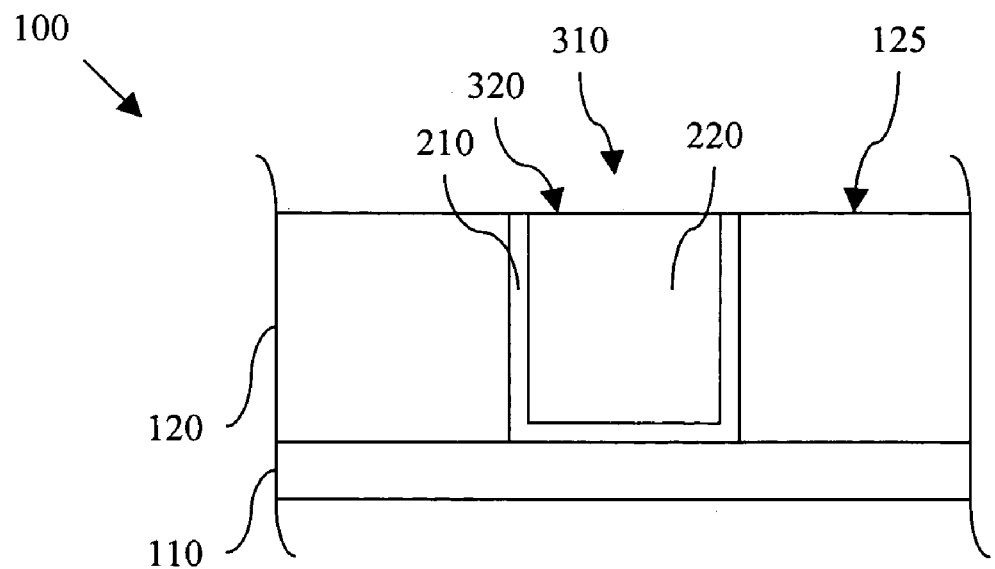
FIG. 3 illustrates a sectional view of one embodiment of a substantially completed metal-filled opening constructed according to aspects of the present disclosure.

Referring to FIG. 3, illustrated is a sectional view of the device 100 shown in FIG. 2 after undergoing planarization to form a metal-filled opening 310 according to aspects of the present disclosure. A CMP process, a plasma etch-back process or combinations thereof may be employed to provide a substantially planar surface 320 of the metal-filled opening 310. As shown in FIG. 3, the substantially planar surface 320 may be coincident with a surface 125 of the dielectric layer 120. However, the substantially planar surface may also be coincident with other features above or below the dielectric layer surface 125, such as the etch stop layer 130 introduced in FIG. 1. Moreover, although FIG. 3 depicts the planarized metal-filled opening 310 as comprising only portions of the barrier layer 210 and conductive bulk layer 220, the metal-filled opening 310 may also include portions of other layers formed prior to planarization. For example, a portion of the conductive cap layer 230 of FIG. 2 may remain in the metal-filled opening 310 after planarization, and may contribute to the electrical characteristics of the metal-filled opening 310 (e.g., by lowering resistance).

In one embodiment in which a plasma etch-back process may be employed during planarization, an etch chemistry of Hfac and $O_2$ may be employed. In such an embodiment, if the conductive cap layer 230 comprises copper or a copper alloy, the conductive cap layer 230 may be simultaneously oxidized to form CuO and etched by the Hfac. Employing a plasma etch-back process during planarization may be advantageous if prior and/or subsequent processing includes the deposition of a low-k dielectric by PECVD or CVD. That is, the processes may be coupled together on a cluster tool, such that the plasma etch-back may be performed without removing the device 100 from the cluster tool.

As discussed above, dishing of conventional metal-filled openings may be caused by variations in materials, the variation in the topography of the various layers, and variations in planarization parameters. However, such dishing may be substantially reduced or eliminated by changing the composition of the layers that are planarized during device fabrication. Thus, the present disclosure introduces the concept of changing the composition of the layers employed to form interconnects or other metal-filled openings.

More specifically, the composition of the conductive bulk layer 220 described above may be altered by incorporating the conductive cap layer 230, wherein the conductive cap layer 230 may comprise a harder material than the conductive bulk layer 220. In one embodiment, this may be accomplished by providing a conductive cap layer 230 comprising material of a smaller grain size than that of the conductive bulk layer 220. As such, dishing may be substantially reduced or eliminated during subsequent planarization. That is, soft materials may be etched or polished faster than harder materials, especially during CMP processing, such that less mechanical force may be employed to planarize features formed by the soft materials as compared to harder materials. Accordingly, adding the harder material of the conductive cap layer 230 to the conductive bulk layer 220 may provide greater resistance to planarization, such that dishing during planarization may be reduced or eliminated.

The reduction or elimination of dishing in the metal-filled opening 310 may provide a reduction in the variation of resistance and other electrical characteristic values for the metal-filled opening 310, which may be advantageous if, for example, the metal-filled opening 310 is employed as a via or interconnect. The interface between the metal-filled opening 310 and materials formed thereon may also be improved by the reduction or elimination of dishing. Consequently, stress build-up may be reduced or eliminated, delamination may be avoided, and device performance and yield may be improved.

Moreover, there are a number of processes by which the conductive cap layer 230 may be employed to reduce dishing of the resulting metal-filled opening 310. For example, as discussed above, the conductive cap layer 230 may be formed on the conductive bulk layer 220 prior to planarization, or the conductive cap layer 230 may be formed between first and second conductive bulk layers 220, 240. Accordingly, the conductive cap layer 230 may be implemented with little impact to manufacturing time and costs, may be readily incorporated into existing manufacturing processes, and may be performed with existing manufacturing processes and equipment.

Figure 4:
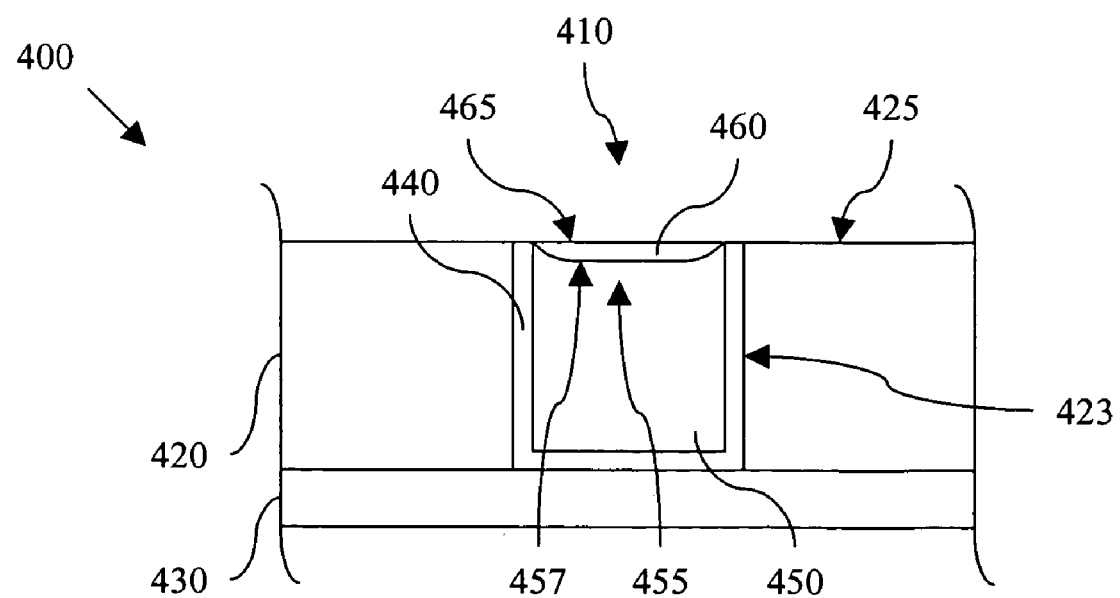
FIG. 4 illustrates a sectional view of another embodiment of a substantially completed metal-filled opening constructed according to aspects of the present disclosure.

Referring to FIG. 4, illustrated is a section view of another embodiment of a device 400 having a metal-filled opening 410 constructed according to aspects of the present disclosure. The initial manufacturing steps employed to form the metal-filled opening 410 may be substantially similar to those employed to form the metal-filled opening 310 shown in FIG. 3. For example, a dielectric layer 420 may be formed on a substrate 430, an opening 423 may be formed in the dielectric layer 420, and a barrier layer 440 may be formed in the opening 423. A conductive bulk layer 450 may then be formed in the opening 423. The dielectric layer 420, opening 423, substrate 430, barrier layer 440 and conductive bulk layer 450 may be substantially similar to the dielectric layer 120, opening 140, substrate 110, barrier layer 210 and conductive bulk layer 220, respectively, discussed above. However, in the example shown in FIG. 4, the device 400 may be planarized after the conductive bulk layer 450 is formed, or at least before depositing a conductive cap layer 460. Because the conductive bulk layer 450 is planarized before altering its composition, the conductive bulk layer 450 may experience dishing 455 within the opening 423 in the dielectric layer 420. Accordingly, the conductive bulk layer 450 may have a non-planar surface 457 at least partially within the opening 423 in the dielectric layer 420. 35

Subsequently, the conductive cap layer 460 may be formed on the conductive bulk layer 450, such as by the processes described above with reference to the conductive cap layer 230 of FIG. 3. Generally, the conductive cap layer 460 may be deposited to a thickness sufficient to fill the dishing region 455. The conductive cap layer 460 may then be planarized to provide a substantially planar surface 465 which may be substantially coincident with a surface 425 of the dielectric layer 420. As with the examples discussed above, the planar surface 465 of the conductive cap layer 460 may also be coincident with other layers not shown in FIG. 4, such as an etch stop layer on the dielectric layer 420, depending on the desired planarization end-point.

Although there are many processes by which the conductive cap layer 460 may be planarized, including CMP, employing a plasma etch-back process during planarization may be advantageous when the conductive cap layer 460 is employed to fill the dishing region 455 of the conductive bulk layer 450. As discussed above, a plasma etch-back process employed to planarize the conductive cap layer 460 may include an etch chemistry of Hfac and $O_2$. As such, if the conductive cap layer 460 comprises copper or a copper alloy, the conductive cap layer 460 may be simultaneously oxidized to form CuO and etched by the Hfac.

The embodiment shown in FIG. 4 may be advantageous in that it may be selectively employed when dishing of the planarized conductive bulk layer 450 is detected (e.g., by optical detection of layer thickness). Accordingly, the conductive cap layer 460 may not be required for each manufacturing lot or wafer, such that the additional process steps required to deposit and planarize the conductive cap layer 460 may be avoided when no dishing occurs during planarization of the conductive bulk layer 450. However, when the conductive cap layer 460 is needed to correct dishing in the planarized conductive bulk layer 450, the processes employed to deposit and planarize the conductive cap layer 460 may be readily implemented with minimal impact to manufacturing time and costs and easily inserted into existing manufacturing processes with existing manufacturing equipment, such as if the conductive cap layer 460 fabrication processes are in-situ. Moreover, the advantages of the metal-filled opening 310 of FIG. 3 may similarly apply to the metal-filled opening 410, such as reduced variation in electrical characteristics of the metal-filled opening 410 and improved device yield and performance.

Figure 5:
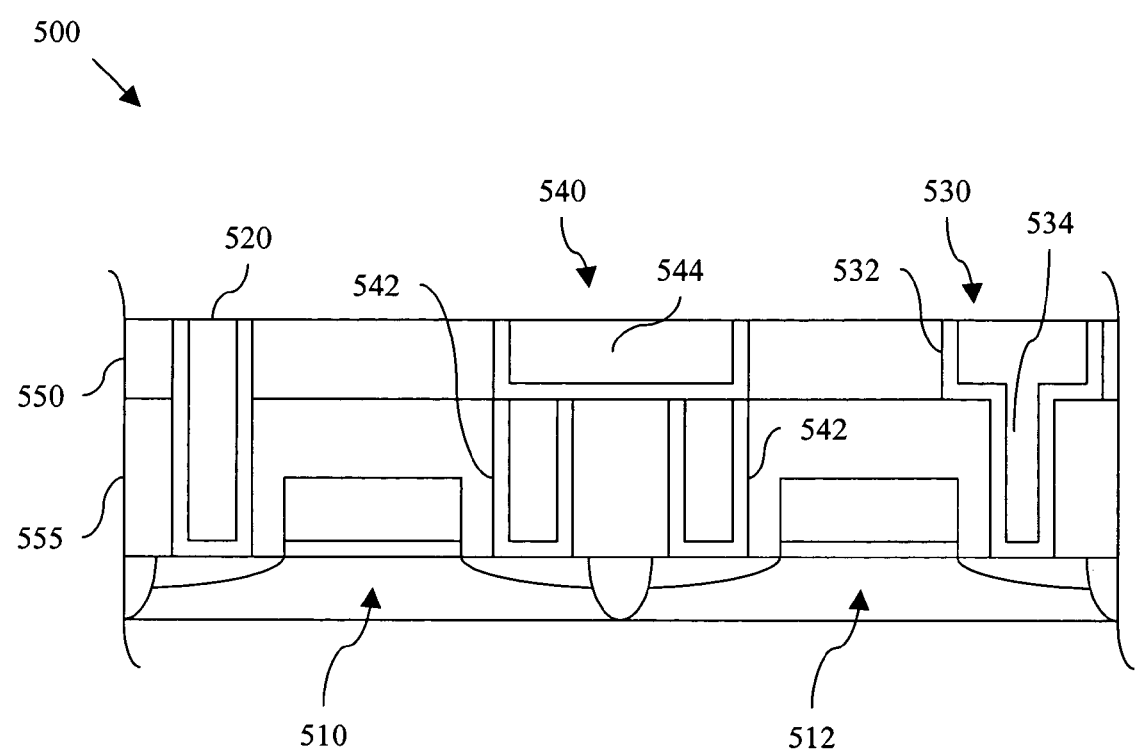
FIG. 5 illustrates a sectional view of one embodiment of a submicron device constructed according to aspects of the present disclosure.

Referring to FIG. 5, illustrated is a section view of one embodiment of a submicron device 500 constructed according to aspects of the present disclosure. The submicron device 500 may be one embodiment in which the metal-filled opening 310 of FIG. 3 and/or the metal-filled opening 410 of FIG. 4 may be implemented. In one embodiment, the submicron device 500 may be a semiconductor device, as known in the art. Those skilled in the art understand that semiconductor devices generally comprise a plurality of active and/or passive devices. Exemplary active devices may include complementary metal-oxide-semiconductor (CMOS) transistors, and exemplary passive devices may include inductive and capacitive elements. In the particular example shown in FIG. 5, the submicron device 500 includes two active devices 510, 512, which may be CMOS transistors. Of course, the submicron device 500 may include any combination of active and/or passive devices within the scope of the present disclosure.

The submicron device 500 also includes interconnects 520, 530, 540 employed to interconnect the active devices 510, 512 to each other and to other devices (not shown). The interconnects 520, 530, 540 may be formed in one or more dielectric layers 550, 555. One or more of the interconnects 520, 530, 540 may be substantially similar to the metal-filled opening 310 of FIG. 3 and/or the metal-filled opening 410 of FIG. 4. As such, the interconnects 520, 530, 540 may exhibit little or no dishing, such that desired electrical characteristics of the interconnects 520, 530, 540 may be achieved and maintained throughout fabrication of the device 500, and the likelihood of separation or stress build-up between the dielectric layers 550, 555 and other features may be reduced.

The interconnects may include single-damascene structures extending through the multiple dielectric layers 550, 555 to interconnect the active device 510, 512 to other active or passive devices. For example, the interconnect 520 is a single-damascene structure extending through the dielectric layers 550, 555 to the active device 510. The interconnects may also include dual damascene structures. For example, the interconnect 530 is a dual-damascene structure having a trench portion 532 in the dielectric layer 550 and a via portion 534 extending through the dielectric layer 555 to the active device 512. Interconnects constructed according to aspects of the present disclosure may also be used in combination to interconnect multiple devices. For example, the interconnect 540 includes via portions 542 extending through the dielectric layer 555 to the active devices 510, 512, and also includes a trench portion 544 in the dielectric layer 550 coupling the active devices 510, 512 through the via portions 542. Of course, the interconnection provided by the interconnect 540 may also be achieved by a dual-damascene structure having more than one via portion (not shown).

The present disclosure has been described relative to preferred embodiments. Improvements or modifications that become apparent to persons of ordinary skill in the art only after reading this disclosure are deemed within the spirit and scope of the application. For example, it is understood that the metal-filled opening 310 of FIG. 3 and/or the metal-filled opening 410 of FIG. 4 may be used in a variety of applications, and FIG. 5 represents only one such application. It is understood that several modifications, changes and substitutions are intended in the foregoing disclosure and some features of the disclosure may be employed without a corresponding use of other features. Accordingly, it is appropriate that the appended claims be construed broadly and in a manner consistent with the scope of the disclosure.

What is claimed is:

1. A method of forming a metal-filled structure, comprising:
    forming an opening in a surface of a substrate, wherein the substrate includes a dielectric layer;
    forming a barrier layer lining the opening and a surface of the dielectric layer;
    forming a conductive bulk layer over the barrier layer lining the surface of the dielectric layer and in the opening, the conductive bulk layer having a first grain size;
    planarizing the conductive bulk layer to form a planarized conductive bulk surface;
    forming a conductive cap layer over the planarized conductive bulk surface, the conductive cap layer having a second grain size that is substantially smaller than the first grain size, wherein the conductive bulk layer and the conductive cap layer comprises a same material; and
    planarizing the conductive cap layer to form a planar surface.

2. The method as recited in claim 1 wherein the planar surface is substantially coincident with the substrate surface.

3. The method as recited in claim 1 wherein the conductive cap layer has a thickness ranging between 1000 angstroms and 2000 angstroms.

4. The method as recited in claim 1 wherein the metal-filled structure is a dual-damascene structure.

5. The method as recited in claim 1 wherein forming the conductive cap layer includes forming by vapor deposition.

6. The method as recited in claim 1 wherein forming the conductive cap layer includes forming by atomic layer deposition.

7. The method as recited in claim 1 wherein forming the conductive cap layer includes plating copper.

8. The method as recited in claim 1 wherein the second grain size is less than 0.1 microns in diameter.

9. The method as recited in claim 1 wherein the conductive bulk layer is a first conductive bulk layer and further comprising forming a second conductive bulk layer over the conductive cap layer, wherein planarizing at least one of the conductive bulk and cap layers also includes planarizing the second conductive bulk layer.

10. The method as recited in claim 1 wherein the conductive cap layer is formed in-situ with the forming of the conductive bulk layer.

11. The method as recited in claim 1 wherein the conductive cap layer comprises copper.

12. The method as recited in claim 1 wherein the planarizing includes chemical-mechanical polishing.

13. A method of forming a submicron device, comprising:
    providing a substrate;
    forming a plurality of active devices in the substrate;
    forming a dielectric layer over the active devices; and
    forming a metal-filled opening interconnecting the active devices, including:
        forming a recess in a surface of the dielectric layer and extending to at least one of the active devices;
        forming a barrier layer lining the recess and a surface of the dielectric layer;
        forming a conductive bulk layer over the barrier layer lining the surface of the dielectric layer and in the recess contacting the at least one active device the conductive bulk layer having a first grain size;
        planarizing the conductive bulk layer to form a planarized conductive bulk surface;
        forming a conductive cap layer over the planarized conductive bulk surface, the conductive cap layer having a second grain size that is substantially smaller than the first grain size, wherein the conductive bulk layer and the conductive cap layer comprises a same material; and
        planarizing the conductive cap layer to form a planar surface that is substantially coincident with the dielectric layer surface.

14. The method as recited in claim 13 wherein forming the conductive cap layer is performed in-situ with the forming the conductive bulk layer.

15. The method as recited in claim 13 wherein the metal-filled opening is a dual-damascene structure.

16. The method as recited in claim 13 wherein the second grain size is less than 0.1 microns in diameter.

17. The method as recited in claim 13 wherein the planarizing includes chemical-mechanical polishing.

18. The method as recited in claim 13 wherein at least two of the active devices are CMOS transistors.

* * * * *